United States Patent
Arnold (10) Patent No.: US 9,490,257 B2
(45) Date of Patent: Nov. 8, 2016

(54) DEEP TRENCH POLYSILICON FIN FIRST

(71) Applicant: GLOBALFOUNDRIES INC., Grand Cayman (KY)

(72) Inventor: Norbert Arnold, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/574,460

(22) Filed: Dec. 18, 2014

(65) Prior Publication Data

US 2016/0181252 A1 Jun. 23, 2016

(51) Int. Cl.
*H01L 21/02* (2006.01)
*H01L 27/108* (2006.01)
*H01L 49/02* (2006.01)

(52) U.S. Cl.
CPC ......... *H01L 27/10829* (2013.01); *H01L 28/90* (2013.01)

(58) Field of Classification Search
CPC ................................. H01L 27/10829
USPC ...................................... 257/534
See application file for complete search history.

(56) References Cited

U.S. PATENT DOCUMENTS

| 8,673,729 | B1 | 3/2014 | Basker et al. |
| 2009/0184356 | A1 | 7/2009 | Brodsky et al. |
| 2011/0248326 | A1 | 10/2011 | Kanakasabapathy et al. |
| 2012/0104547 | A1 | 5/2012 | Ervin et al. |
| 2013/0099229 | A1 | 4/2013 | Wakana et al. |
| 2013/0320422 | A1 | 12/2013 | Chang et al. |
| 2013/0320423 | A1 | 12/2013 | Beaudoin et al. |
| 2014/0027831 | A1 | 1/2014 | Basker et al. |

OTHER PUBLICATIONS

Anonymous "Trench DRAM with FinFET/nanowire access transistor and method formation" IP.com No. IPCOM000231566D (Oct. 7, 2013) pp. 1-4.

*Primary Examiner* — Anthony Ho
(74) *Attorney, Agent, or Firm* — Scully, Scott, Murphy & Presser, P.C.

(57) ABSTRACT

After forming a recessed conductive material portion over a deep trench capacitor located in a lower portion of a deep trench embedded in a substrate, a hard mask layer is formed over a top semiconductor layer of the substrate and the recessed conductive material portion such that the hard mask layer completely fills the deep trench. Next, the hard mask layer, the top semiconductor layer and the recessed conductive material portion are patterned to form a laterally contacting pair of a semiconductor fin and a conductive strap structure over the deep trench capacitor as well as a dielectric cap embedded in the deep trench. The dielectric cap vertically contacts a lower portion of the conductive strap structure and laterally surrounds a portion of an upper portion of the conductive strap structure that is not in contact with the semiconductor fin.

10 Claims, 9 Drawing Sheets

DEEP TRENCH POLYSILICON FIN FIRST

BACKGROUND

The present application relates to semiconductor device fabrication, and more particularly to a semiconductor structure and a method that prevent shorts between neighboring deep trenches in embedded dynamic random access memory (eDRAM) devices.

Deep trench capacitors are used in a variety of semiconductor chips for high areal capacitance and low device leakage. A deep trench capacitor may be employed as a charge storage unit in a dynamic random access memory (DRAM), which may be provided as a stand-alone semiconductor chip, or may be embedded in a system-on-chip (SoC) semiconductor chip. A deep trench capacitor may also be employed in a variety of circuit applications such as a charge pump or a capacitive analog component in a radio-frequency (RF) circuit.

A deep trench capacitor is typically electrically connected to associated transistors through a conductive strap structure. Since the conductive strap is normally composed of a conductive semiconductor material such as doped polysilicon, during later selective epitaxy processes in the formation of source/drain regions, the epitaxial growth of a semiconductor material may occur on the surface of the conductive strap structure. As dimensions of semiconductor devices scale, the distance between neighboring deep trenches becomes smaller. The epitaxial grown semiconductor material on the conductive strap structure may extend out of the deep trench to bridge the neighboring deep trenches, causing shorts between the neighboring deep trenches. As such, a method is needed to eliminate epitaxial growth of semiconductor material extending out of the deep trench, thus preventing shorts between neighboring deep trenches.

SUMMARY

The present application provides a method of preventing shorts between neighboring deep trenches caused by an epitaxial overgrowth of a semiconductor material on a conductive strap structure employed to connect a deep trench capacitor and associated transistors during the formation of source/drain regions in fin field effect transistors (FinFETs). After forming a recessed conductive material portion over a deep trench capacitor located in a lower portion of a deep trench embedded in a substrate, a hard mask layer is formed over a top semiconductor layer of the substrate and the recessed conductive material portion such that the hard mask layer completely fills the deep trench. Next, the hard mask layer, the top semiconductor layer and the recessed conductive material portion are patterned to form a laterally contacting pair of a semiconductor fin and a conductive strap structure over the deep trench capacitor as well as a dielectric cap embedded in the deep trench. The dielectric cap vertically contacts a lower portion of the conductive strap structure and laterally surrounds a portion of an upper portion of the conductive strap structure that is not in contact with the semiconductor fin. No epitaxial growth of the semiconductor material can occur on a top surface of the dielectric cap, thus preventing the epitaxial grown semiconductor material extending out of deep trench.

In one aspect of the present application, a semiconductor structure is provided. The semiconductor structure includes a semiconductor fin located on a substrate, a deep trench capacitor embedded in the substrate, and a conductive strap structure overlying the deep trench capacitor. The conductive strap structure includes a lower portion vertically contacting topmost surfaces of the deep trench capacitor and an upper portion adjoined a portion of the lower portion. The upper portion of the conductive strap structure has a first portion laterally contacting the semiconductor fin and a second portion underlying the first portion contacting a portion of the lower portion. The semiconductor structure further includes a dielectric cap embedded in the substrate. The dielectric cap vertically contacts another portion of the lower portion of the conductive strap structure and laterally surrounds the second portion of the upper portion of the conductive strap structure.

In another aspect of the present application, a method of forming a semiconductor structure is provided. The method includes forming deep trench capacitors in a substrate. Laterally contacting pairs of a semiconductor fin and a conductive strap structure are then formed. The conductive strap structure in each of the laterally contacting pairs has a lower portion vertically contacting topmost surfaces of one of the deep trench capacitors and an upper portion adjoined a portion of the lower portion, the upper portion having a first portion laterally contacting the semiconductor fin and a second portion laterally contacting an upper portion of the substrate and laterally surrounded by a portion of each of dielectric trench fill portions that is embedded in the substrate. Next, dielectric caps are formed by removing another portion of each of the dielectric trench fill portions that is located above a topmost surface of the substrate. Each of the dielectric caps vertically contacts another portion of the lower portion of the conductive strap structure and laterally surrounds the second portion of the upper portion of the conductive strap structure.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1A:
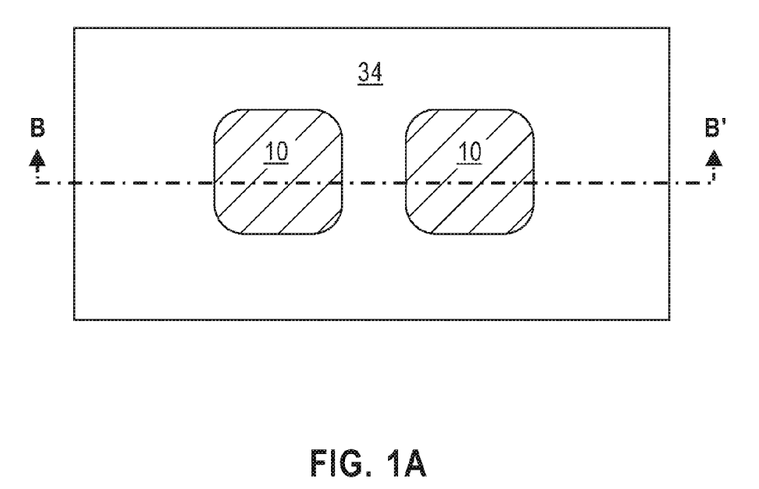
FIG. 1A is a top-down view of an exemplary semiconductor structure after forming deep trenches within a semiconductor-on-insulator (SOI) substrate according to an embodiment of the present application.
Figure 1B:
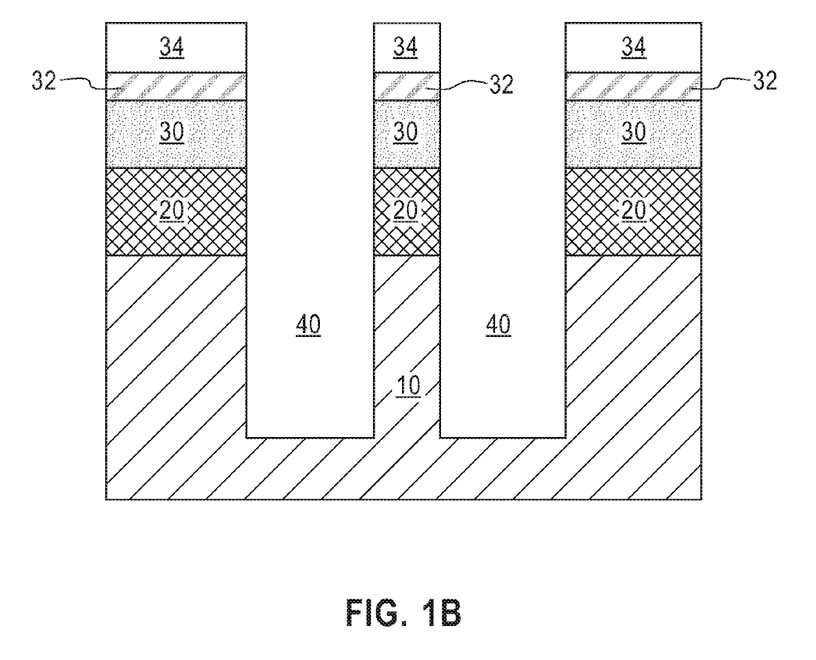
FIG. 1B is a cross-sectional view of the exemplary semiconductor structure of FIG. 1A along the vertical plane B-B'.

Referring to FIGS. 1A and 1B, an exemplary semiconductor structure according to an embodiment of the present application includes a semiconductor-on-insulator (SOI) substrate having deep trenches 40 formed therein. The SOI substrate includes a stack, from bottom to top, of a bottom semiconductor layer 10, a buried insulator layer 20, and a top semiconductor layer 30. In some embodiment of the present application, an optional n-doped epitaxial semiconductor layer may be present between the bottom semiconductor layer 10 and the buried insulator layer 20 (not shown).

The bottom semiconductor layer 10 may include a semiconductor material, such as, for example, Si, Ge, SiGe, SiC, SiGeC, a compound semiconductor material such as a III-V compound semiconductor material or a II-VI compound semiconductor material, or a combination thereof. In one embodiment, the bottom semiconductor layer 10 is composed of single crystalline silicon. The thickness of the bottom semiconductor layer 10 can be from 50 µm to 2 mm, although lesser and greater thicknesses can also be employed.

The buried insulator layer 20 may include a dielectric material such as silicon oxide, silicon nitride, silicon oxynitride, or a combination thereof. In one embodiment, the buried insulator layer 14 may be formed by a deposition process, such as chemical vapor deposition (CVD) or physically vapor deposition (PVD). In another example, the buried insulator layer 20 may be formed using a thermal growth process, such as thermal oxidation, to convert a surface portion of the bottom semiconductor layer 10. The thickness of the buried insulator layer 20 that is formed can be from 50 nm to 200 nm, although lesser or greater thicknesses can also be employed.

The top semiconductor layer 30 may include a semiconductor material, such as, for example, Si, Ge, SiGe, SiC, SiGeC, a compound semiconductor material such as a III-V compound semiconductor material or a II-VI compound semiconductor material, or a combination thereof. The semiconductor materials of the top semiconductor layer 30 and the bottom semiconductor layer 10 may be the same or different. In one embodiment, the top semiconductor layer 30 includes a single crystalline semiconductor material, such as, for example, single crystalline silicon. The top semiconductor layer 30 may or may not be doped with p-type dopants and/or n-type dopants. The top semiconductor layer 30 may be formed by a deposition process, such as CVD or plasma enhanced CVD (PECVD). The top semiconductor layer 30 that is formed may have a thickness from 10 nm to 200 nm, although lesser or greater thicknesses can also be employed.

At least one pad layer can be deposited on the SOI substrate (10, 20, 30), for example, by CVD or atomic layer deposition (ALD). The at least one pad layer can include one or more layers that can be employed as an etch mask for forming deep trenches 40 in the SOI substrate (10, 20, 30). As used herein, a "deep trench" refers to a trench that extends from a topmost surface of a semiconductor-on-insulator (SOI) substrate through a top semiconductor layer and a buried insulator layer and partly into an underlying bottom semiconductor layer. The at least one pad layer can include a dielectric material and can have a thickness from 100 nm to 2 µm, although lesser and greater thicknesses can also be employed.

In one embodiment, the at least one pad layer can include a vertical stack of, from bottom to top, a pad oxide layer 32 and a pad nitride layer 34. The pad oxide layer 32 may include a dielectric oxide material such as silicon oxide or a dielectric metal oxide. The pad nitride layer 34 may include a dielectric nitride material such as silicon nitride or a dielectric metal nitride. In one embodiment, the thickness of the pad oxide layer 32 can be from 2 nm to 50 nm, and the thickness of the pad nitride layer 34 can be from 40 nm to 360 nm, although lesser and greater thicknesses can also be employed for each of the pad oxide layer 32 and the pad nitride layer 34.

A mask layer (not shown) can be applied over the pad nitride layer 34 and is lithographically patterned to form openings. The mask layer can be a photoresist layer or a photoresist layer in conjunction with hardmask layer(s). Each of the openings has an area of a deep trench 40 to be subsequently formed. The pattern in the photoresist layer can be transferred into the at least one pad layer (32, 34) to form openings in the at least one pad layer (32, 34).

Subsequently, the pattern in the at least one pad layer (32, 34) can be transferred through the top semiconductor layer 30, the buried insulator layer 20, and an upper portion of the bottom semiconductor layer 10 or an upper portion of the n-doped epitaxial semiconductor layer, if present, by an anisotropic etch that employs the at least one pad layer (32, 34) as an etch mask. The deep trenches 40 can thus be formed in the SOI substrate (10, 20, 30) from the pattern of openings in the at least one pad layer (32, 34). The photoresist can be removed by ashing, or can be consumed during the etch process that forms the deep trenches 40.

In one embodiment and as shown in FIG. 1B, the sidewalls of each deep trench 40 can be substantially vertically aligned among the various layers (34, 32, 30, 20, 10) through which the deep trench 40 extends. The depth of each deep trench 40 as measured from the topmost surface of the SOI substrate (10, 20, 30) to the bottom surface of the deep trench 40 can be from 500 nm to 10 microns, although lesser and greater depths can also be employed. The width (i.e., the lateral distance between sidewalls) of each deep trench 40 can be from 32 nm to 150 nm, although lesser dimensions can be employed with availability of lithographic tools capable of printing smaller dimensions in the future. In one embodiment, the width of each deep trench 40 is 90 nm.

Figure 2A:
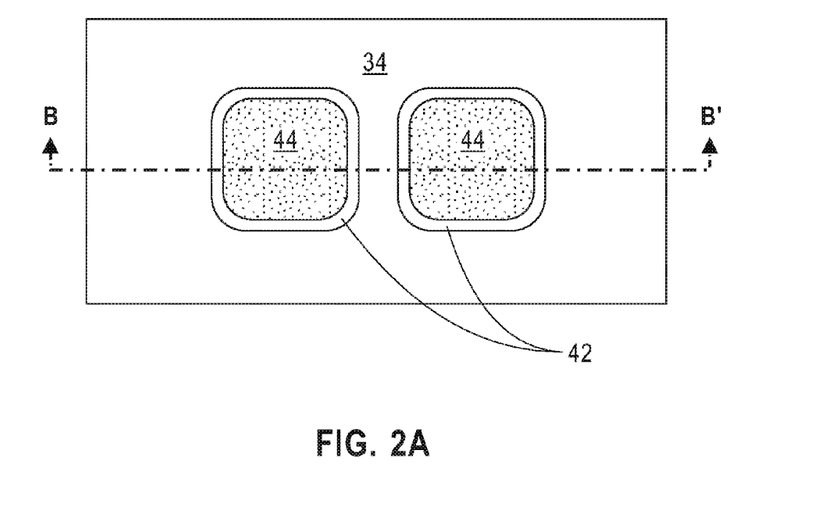
FIG. 2A is a top-down view of the exemplary semiconductor structure of FIGS. 1A-1B after forming deep trench capacitors.
Figure 2B:
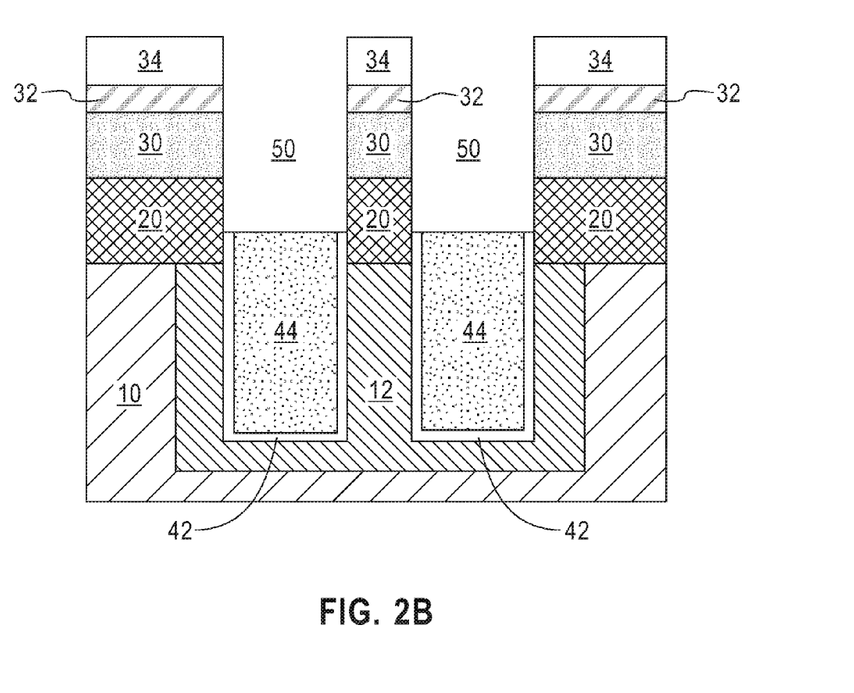
FIG. 2B is a cross-sectional view of the exemplary semiconductor structure of FIG. 2A along the vertical plane B-B'.

Referring to FIGS. 2A and 2B, deep trench capacitors (42, 44, 12) are formed in deep trenches 40. In one embodiment of the present application, a buried plate 12 may be first formed in proximity of sidewalls of each deep trench 40. Each buried plate 12 serves as an outer electrode for a deep trench capacitor subsequently formed. In another embodiment of the present application and when the n-doped epitaxial semiconductor layer is present, a portion of the n-doped semiconductor layer surrounding each deep trench 40 can serve as an outer electrode for each deep trench capacitor subsequently formed and processing steps of forming the buried plates 12 described below can be omitted. The buried plate 12 can be formed by doping a portion of the bottom semiconductor layer 10 in proximity of sidewalls of each deep trench 40. Dopants can be introduced, for example, by outdiffusion from a dopant-including disposable material (such as a doped silicate glass) or by ion implantation as known in the art. Further, any other method of forming buried plates 12 in the bottom semiconductor layer 10 of the SOI substrate (10, 20, 30) can be employed in lieu of outdiffusion from a dopant-including disposable material or ion implantation.

In one embodiment and if the bottom semiconductor layer 10 is doped with dopants of a first conductivity, the buried plate 12 can be doped with dopants of a second conductivity type which is the opposite of the first conductivity type. For example, the first conductivity type can be p-type and the second conductivity type can be n-type, or vice versa. A p-n junction is thus formed between the remaining portion of the bottom semiconductor layer 10 and each buried plate 12. The dopant concentration in the buried plate 12 can be, for example, from $1.0 \times 10^{18}/cm^3$ to $2.0 \times 10^{21}/cm^3$, and typically from $5.0 \times 10^{18}/cm^3$ to $5.0 \times 10^{19}/cm^3$, although lesser and greater dopant concentrations can also be employed.

A node dielectric layer (not shown) can be deposited conformally on sidewalls and bottom surfaces of the deep trenches 40 as well as sidewalls and the topmost surface of the at least one pad layer (32, 34). The node dielectric layer can include any dielectric material that can be employed as a node dielectric material in a capacitor known in the art. For example, the node dielectric layer can include at least one of silicon nitride and a dielectric metal oxide material such as high dielectric constant (high-k) gate dielectric material as known in the art.

An inner electrode layer (not shown) can be deposited to completely fill the deep trenches 40. The inner electrode layer can include a conductive material, which can be a metallic material or a doped semiconductor material. The metallic material can be an elemental metal such as W, Ti, Ta, Cu, or Al, or an alloy of at least two elemental metals, or a conductive metallic nitride of at least one metal, or a conductive metallic oxide of at least one metal. The doped semiconductor material can be a doped elemental semiconductor material, a doped compound semiconductor material, or an alloy thereof. The inner electrode layer can be deposited by physical vapor deposition (PVD), chemical vapor deposition (CVD), ALD, electroplating, electroless plating, or a combination thereof. The inner electrode layer is deposited to a thickness that is sufficient to completely fill the deep trenches 40.

The inner electrode layer is vertically recessed to a level between the top surface of the buried insulator layer 20 and the bottom surface of the buried insulator layer 20 by a recess etch. The recess etch of the conductive material layer can employ an anisotropic etch such as a reactive ion etch (RIE), an isotropic etch such as a wet etch, or a combination thereof. The recess etch can be selective to the material of the node dielectric layer. Each remaining portion of the inner electrode layer within the deep trenches 40 constitutes an inner electrode 44. The topmost surface of each inner electrode 44 is substantially planar, and is located between the top surface of the buried insulator layer 20 and the bottom surface of the buried insulator layer 20.

The physically exposed portions of the node dielectric layer that are not covered by the inner electrode 44 can be removed by a recess etch, which can be a dry etch, such as, for example, RIE. Each remaining portion of the node dielectric layer within the deep trenches 40 constitutes a node dielectric 42. The topmost surfaces of the node dielectric 42 are coplanar with the topmost surfaces of inner electrode 44. A cavity 50 is formed above the node dielectric 42 and the inner electrode 44.

Each set of the node dielectric 42, the inner electrode 44, and the buried plate 12 around a deep trench 40 constitutes a trench capacitor (42, 44, 12). The buried plate 12 serves as the outer electrode of the deep trench capacitor (42, 44, 12). The deep trench capacitors (42, 44, 12) are embedded within the SOI substrate (10, 20, 30).

Figure 3A:
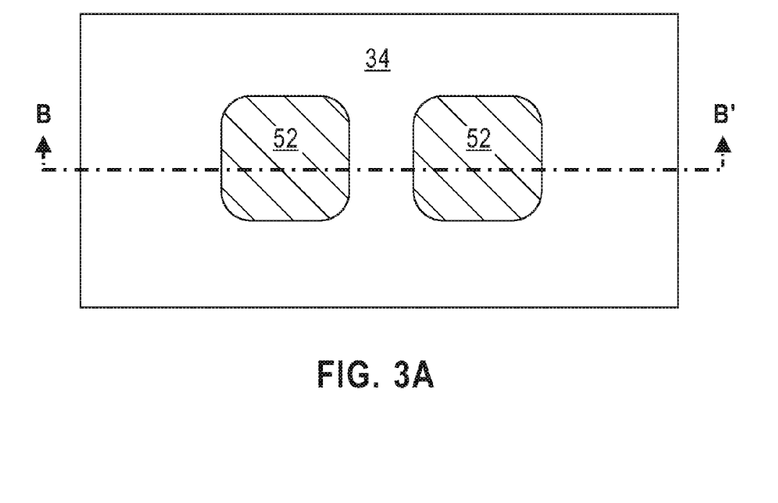
FIG. 3A is a top-down view of the exemplary semiconductor structure of FIGS. 2A-2B after forming conductive material portions over the deep trench capacitors.
Figure 3B:
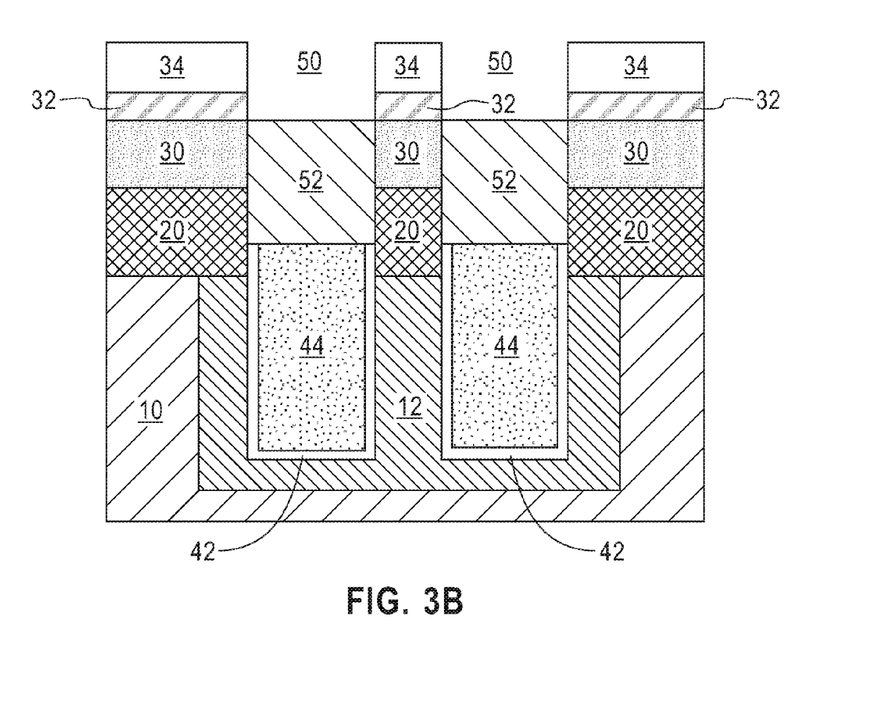
FIG. 3B is a cross-sectional view of the exemplary semiconductor structure of FIG. 3A along the vertical plane B-B'.

Referring to FIGS. 3A and 3B, conductive material portions 52 are formed over the deep trench capacitors (42, 44, 12). The conductive material portions 52 can be formed, for example, by depositing a conductive material within the cavities 50 and above the at least one pad layer (32, 34), and subsequently recessing the conductive material. Specifically, the conductive material can be a doped elemental semiconductor material, a doped compound semiconductor material, or an alloy thereof. The semiconductor material can be deposited by CVD or PVD with in-situ doping of p-type dopants or n-type dopants. In one embodiment, the conductive material portions 52 have a conductivity type the same as the inner electrode 44, but opposite to the top semiconductor layer 30. The conductive material may be deposited to a thickness that is sufficient to completely fill the cavities 50.

The conductive material can be planarized, for example, by chemical mechanical planarization (CMP) employing the pad nitride layer 34 as a stopping layer. Subsequently, the conductive material is recessed to a depth between the top surface of the pad oxide layer 32 and the bottom surface of the top semiconductor layer 30 to provide the conductive material portions 52. In one embodiment and as shown in FIG. 3B, top surfaces of the conductive material portions 52 are substantially coplanar with the top surface of the top semiconductor layer 30. A recess etch which can be an anisotropic etch such as RIE may be employed to form the conductive material portions 52. Each conductive material portion 52 is in contact with, and overlies, an inner electrode 44.

Figure 4A:
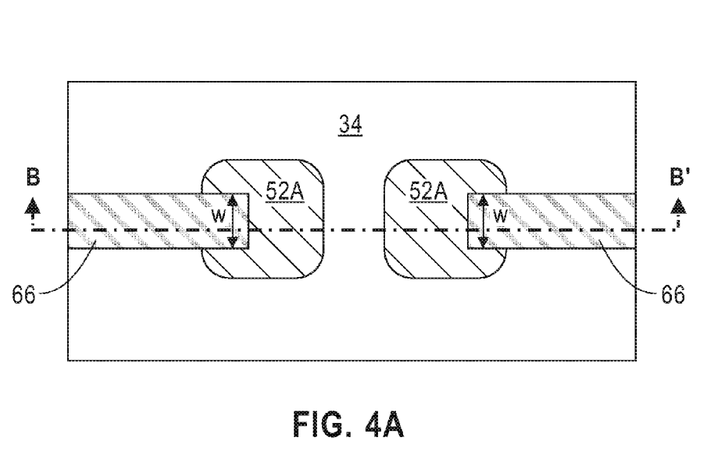
FIG. 4A is a top-down view of the exemplary semiconductor structure of FIGS. 3A-3B after forming recessed conductive material portions.
Figure 4B:
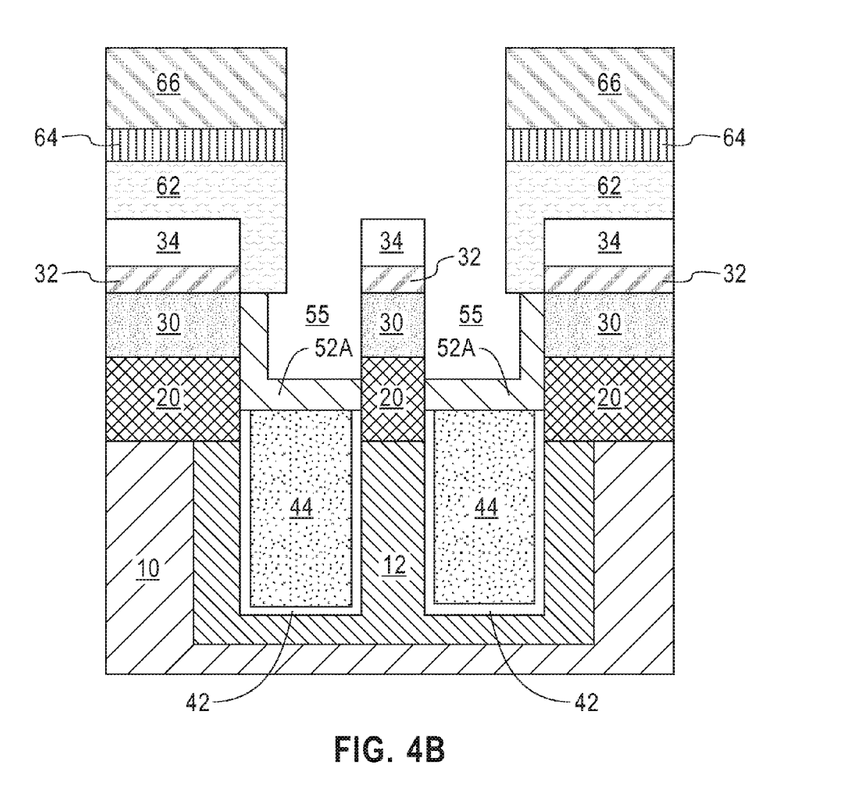
FIG. 4B is a cross-sectional view of the exemplary semiconductor structure of FIG. 4A along the vertical plane B-B'.

Referring to FIGS. 4A and 4B, a lithographic stack can be applied over the pad nitride layer 34 and the conductive material portions 52. The lithographic stack may include, from bottom to top, an organic planarization layer (OPL) (not shown), an antireflective coating (ARC) layer (not shown) and a photoresist layer (not shown). The OPL may include a self-planarizing organic material which can be polyacrylate resin, epoxy resin, phenol resin, polyamide resin, polyimide resin, unsaturated polyester resin, polyphenylenether resin, or polyphenylene sulfide resin. The OPL can be applied over the pad nitride layer 34 and the conductive material portions 52, for example, by spin-coating. The OPL that is formed has a top surface located above the top surface of the pad nitride layer 34 such that the OPL completely fills the cavities 50. The thickness of the OPL can be from 100 nm to 400 nm, although lesser and greater thicknesses can also be employed.

The ARC layer can include any antireflective material known in the art, such as a silicon-containing organic material. The ARC layer can be formed, for example, by spin coating. The thickness of the ARC layer that is formed can be from 10 nm to 150 nm, although lesser and greater thicknesses can also be employed.

The photoresist layer can be a layer of a photoresist sensitive to deep-ultraviolet (DUV) radiation, extreme ultraviolet (EUV), or mid-ultraviolet (MUV) radiation as known in the art, or can be an e-beam resist that is sensitive to radiation of energetic electrons. The photoresist layer can be formed, for example, by spin coating. The thickness of the photoresist layer that is formed can be from 100 nm to 600 nm, although lesser and greater thicknesses can also be employed.

Subsequently, the lithographic stack can be patterned to provide lithographic stack portions. Each patterned lithographic stack portion includes, from bottom to top, an OPL portion 62, an ARC layer portion 64 and a photoresist layer portion 66. Each lithographic stack portion (62, 64, 66) covers a peripheral portion of each conductive material portion 52 and a portion of the top semiconductor layer abutting the peripheral portion of each conductive material portion 52. In one embodiment, each lithographic stack portion (62, 64, 66) can be a rectangle having a parallel pair of vertical sidewalls extending along a lengthwise direction of the lithographic stack portions (62, 64, 66). The width w (i.e., lateral distance between two vertical sidewalls) of each lithographic stack portion (62, 64, 66) is selected to be greater than a width of later formed semiconductor fins. This configuration self-aligns the conductive strap structures that are derived from the conductive material portions 52 to the semiconductor fins, thereby relaxing the lithographic overlay tolerance. In one embodiment, the width w of the lithographic stack portions (62, 64, 66) is 40 nm.

Portions of the conductive material portions 52 that are not masked by the lithographic stack portions (62, 64, 66) may be vertically recessed by an anisotropic etch such as, for example, RIE. An isotropic etch is subsequently performed to undercut the peripheral portions of the conductive material portions 52 that are covered by the lithographic stack portions (62, 64, 66) so as to further reduce the size of the portions of semiconductor material portions 52 underneath the lithographic stack portions (62, 64, 66). The isotropic etch may be a wet etch employing a combination of nitric acid and hydrofluoric acid. The anisotropic etch and the isotropic etch can be selective to the pad nitride layer 34, the pad oxide layer 32 and the buried insulator layer 20. In one embodiment, the exposed portions of the pad nitride layer 34 may be slightly recessed during the etch processes.

In one embodiment, the conductive material portions 52 can be recessed to a depth greater than the thickness of the top semiconductor layer 30 and less than the thickness of the buried insulator layer 20 such that the recessed top surfaces of the semiconductor material portions 52 are located between the top surface of the buried insulator layer 20 and the bottom surface of the buried insulator layer 20. In one embodiment, portions of the conductive material portions 52 can be recessed 50 nm below the top surface of the buried insulator layer 20. Each remaining portion of the semiconductor material portions 52 after the isotropic etch is herein referred to as a recessed conductive material portion 52A. A cavity 55 thus is formed above each recessed conductive material portion 52A within the deep trenches 40.

Each recessed conductive material portion 52A includes a lower portion vertically contacting the inner electrode 44 and an upper portion laterally contacting the top semiconductor layer 30 and the buried insulator layer 20. The lower portion of each recessed conductive material portion 52A is located below the horizontal plane including a recessed top surface of the recessed conductive material portion 52A. The upper portion of each recessed conductive material portion 52A is located above the horizontal plane including the recessed top surface of the recessed conductive material portion 52A. In one embodiment, entire sidewalls of the lower portion of each recessed conductive material portion 52A laterally contact the buried insulator layer 20. A sidewall of the upper portion of each recessed conductive material portion 52 has a first portion laterally contacting the top semiconductor layer 30 and a second portion underlying the first portion laterally contacting the buried insulator layer 20.

Figure 5A:
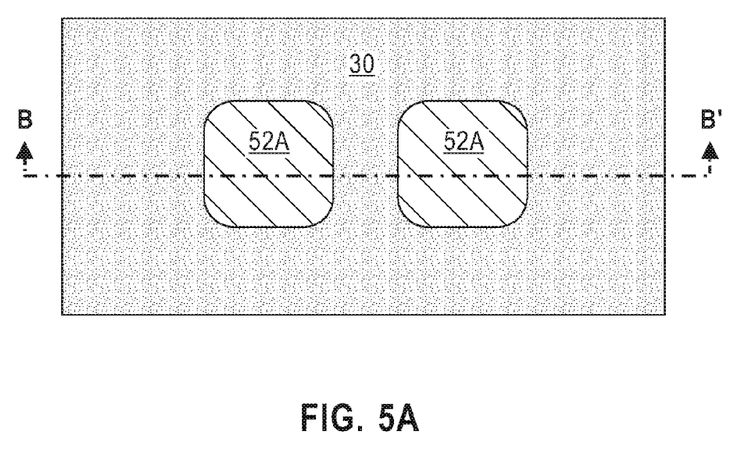
FIG. 5A is a top-down view of the exemplary semiconductor structure of FIGS. 4A-4B after removing lithographic stack portions and at least one pad layer from a top semiconductor layer of the SOI substrate.
Figure 5B:
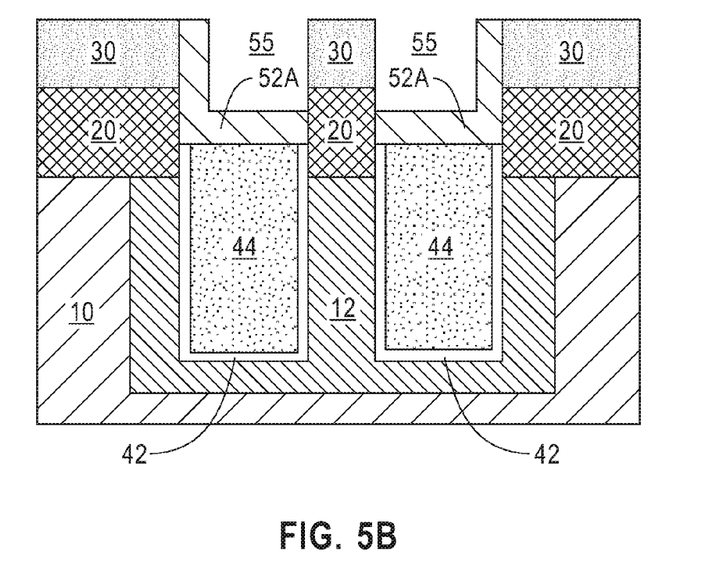
FIG. 5B is a cross-sectional view of the exemplary semiconductor structure of FIG. 5A along the vertical plane B-B'.

Referring to FIGS. 5A and 5B, the lithographic stack portions (62, 64, 66) can be removed by stripping processes. For example, the photoresist layer portions 66 may be removed by ashing. The ARC layer portions 64 may be removed by a wet etch selective to the OPL portions 62. In one embodiment, the ARC layer portions 64 are removed by an acidic solution such as acetic acid. The OPL portions 62 may be removed by an aqueous basic solution.

Subsequently, the at least one pad layer (32, 34) is removed by an etch that is selective to the semiconductor materials of the top semiconductor layer 30 and the recessed conductive material portions 52A. For example, if the pad nitride layer 34 includes silicon nitride and the pad oxide layer 34 includes silicon oxide, a wet etch employing hot phosphoric acid can be utilized to etch the pad nitride layer 34 and a wet etch employing hydrofluoric acid can be utilized to etch the pad oxide layer 32. After removal of the at least pad layer (32, 34), the top surface of the top semiconductor layer 30 may be cleaned by a dilute hydrofluoric acid solution.

Figure 6A:
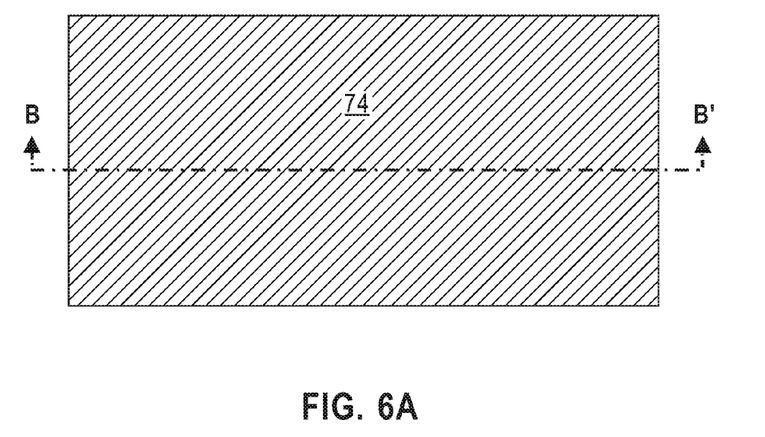
FIG. 6A is a top-down view of the exemplary semiconductor structure of FIGS. 5A-5B after forming a dielectric liner layer and an overlying hard mask layer over the top semiconductor layer and the recessed conductive material portions.
Figure 6B:
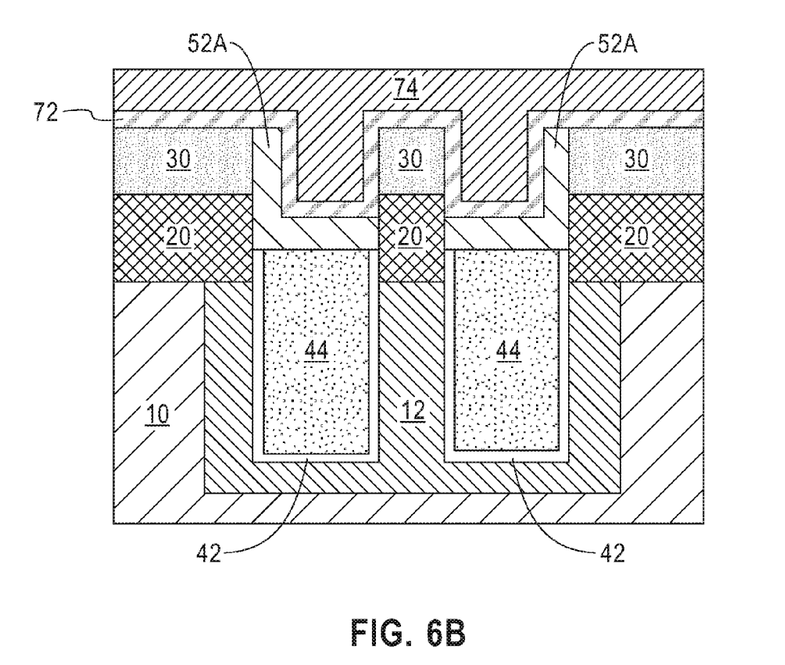
FIG. 6B is a cross-sectional view of the exemplary semiconductor structure of FIG. 6A along the vertical plane B-B'.

Referring to FIGS. 6A and 6B, a dielectric liner layer 72 is deposited on sidewalls and bottom surfaces of the cavities 55, and above the top semiconductor layer 30 and the recessed conductive material portions 52A. The dielectric liner layer 72 may include a dielectric oxide such as silicon oxide. The dielectric liner layer 72 can be formed, for example, by CVD or PECVD. The dielectric liner layer 72 that is formed can have a thickness from 5 nm to 10 nm. The dielectric liner layer 72 is optional, and can be omitted in some embodiments of the present application.

A hard mask layer 74 is deposited on the dielectric liner layer 72, if present, or directly on the sidewalls and bottom surfaces of the cavities 55 and above the top semiconductor layer 30 and the recessed conductive material portions 52A. The hard mask layer 74 may include a dielectric nitride such as silicon nitride. The hard mask layer 74 can be deposited, for example, by CVD or PECVD. The hard mask layer 74 can be deposited to a thickness to completely fill the cavities 55. A top surface of the hard mask layer 74 is located above the top surface of the top semiconductor layer 30.

Figure 7A:
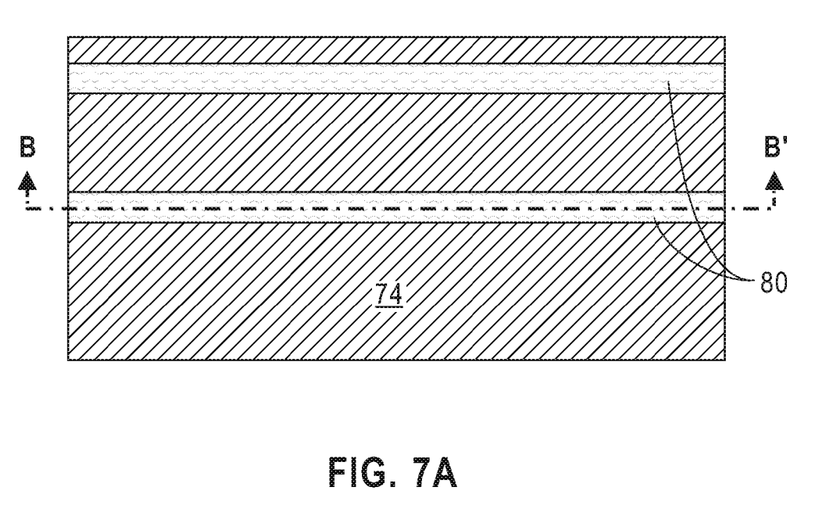
FIG. 7A is a top-down view of the exemplary semiconductor structure of FIGS. 6A-6B after forming fin-defining spacers on the hard mask layer.
Figure 7B:
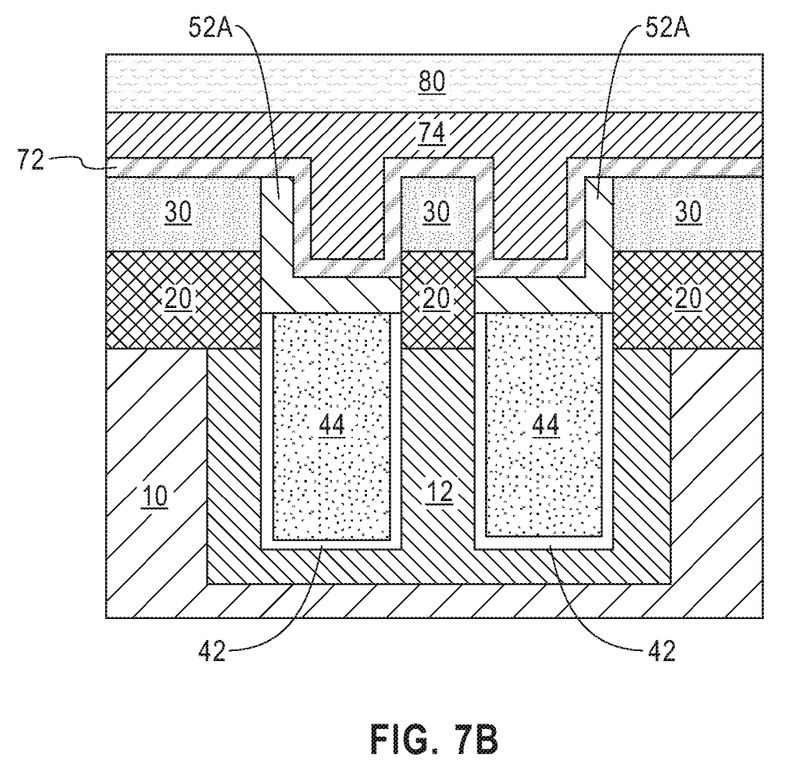
FIG. 7B is a cross-sectional view of the exemplary semiconductor structure of FIG. 7A along the vertical plane B-B'.

Referring to FIGS. 7A and 7B, fin-defining spacers 80 are formed on the hard mask layer 74. In one embodiment and as shown in FIG. 7B, one of the fin-defining spacers 80 overlies recessed conductive material portions 52A. The width of each fin-defining spacer 80, as measured from its base, can be from 5 nm to 30 nm, although lesser and greater thicknesses can also be employed.

In one embodiment, the fin-defining spacers 80 can be formed by a sidewall image transfer (SIT) process. Specifically, a mandrel material layer (not shown) is deposited over the hard mask layer 74. The mandrel material layer may be composed of amorphous silicon, polysilicon, amorphous or polycrystalline germanium, an amorphous or polycrystalline silicon-germanium alloy material, amorphous carbon, diamond-like carbon, or organosilicate glass. The mandrel material layer can be deposited using, for example, CVD or PECVD. The thickness of the mandrel material layer can be from 50 nm to 300 nm, although lesser and greater thicknesses can also be employed. The mandrel material layer then undergoes lithographic and etching processes to form at least one mandrel (not shown). Next, a conformal spacer material layer (not shown) is deposited over the at least one mandrel and exposed portions of the hard mask layer 74 by a conformal deposition process such as, for example, CVD or ALD. The thickness of the spacer material layer may vary depending upon the desired width of final semiconductor fins to be formed in the top semiconductor layer 30, and can be from 5 nm to 30 nm, although lesser and greater thicknesses can also be employed. The spacer material layer may include a dielectric material such as silicon oxide or silicon oxynitride. Horizontal portions of the conformal spacer material layer are then removed utilizing an anisotropic etch, such as, for example, RIE to provide the fin-defining spacers 80 which are remaining portions of the spacer material layer on the sidewalls of the at least one mandrel. The at least one mandrel is removed selective to the fin-defining spacers 80, leaving the fin-defining spacers 80 on top of the hard mask layer 74. The removal of the at least one mandrel can be effected, for example, by a wet etch or a dry etch such as RIE.

Figure 8A:
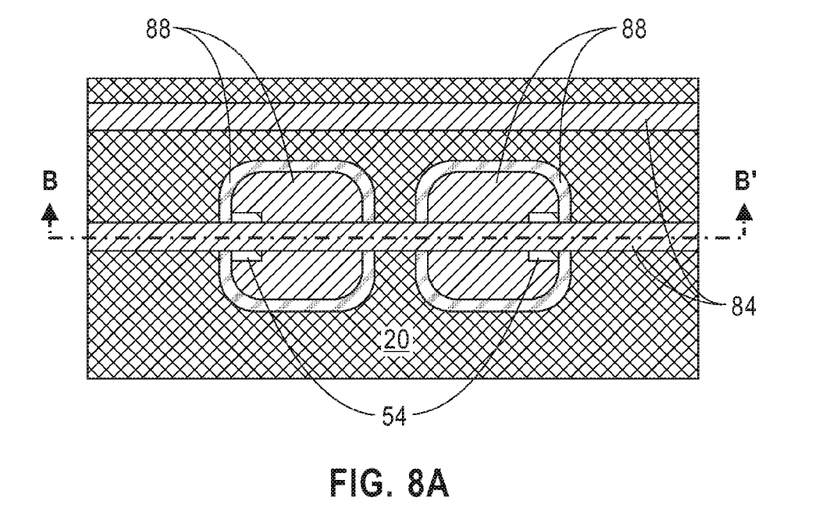
FIG. 8A is a top-down view of the exemplary semiconductor structure of FIGS. 7A-7B after forming laterally contacting pairs of a semiconductor fin and a conductive strap structure.
Figure 8B:
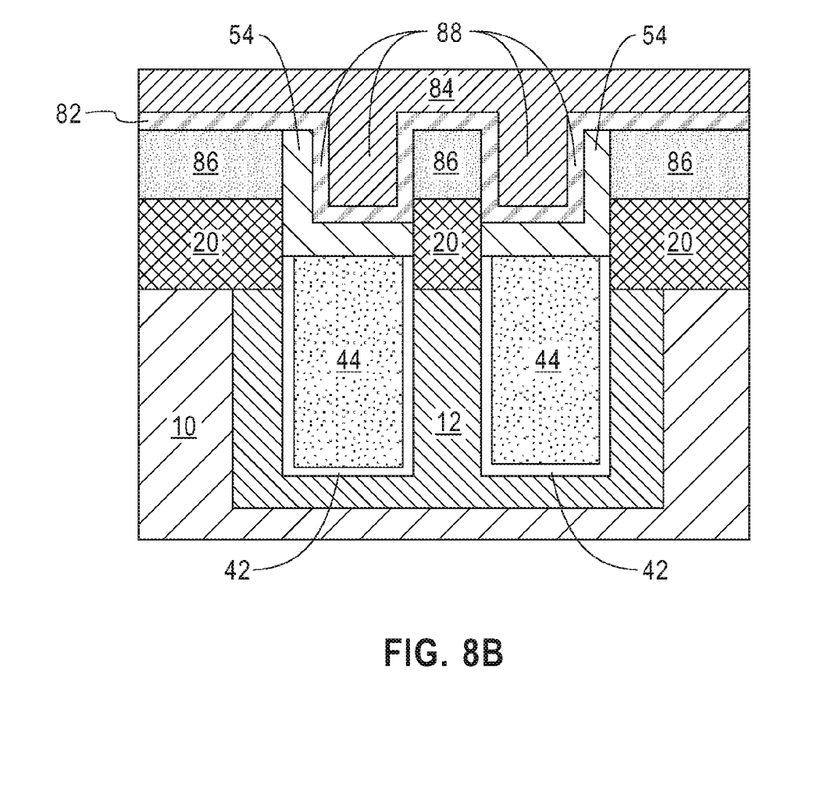
FIG. 8B is a cross-sectional view of the exemplary semiconductor structure of FIG. 7A along the vertical plane B-B'.

Referring to FIGS. 8A and 8B, laterally contact pairs of a semiconductor fin 86 and a conductive strap structure 54 are formed. Specifically, the pattern in the fin-defining spacers 80 can be first transferred into the hard mask layer 74 and the dielectric liner layer 72 by an anisotropic etch using the fin-defining spacers 80 as an etch mask and the top semiconductor layer 30 as a stopping layer. The remaining portions of the dielectric liner layer 72 are herein referred to as dielectric liner portions (not shown). The remaining portions of the hard mask layer 74 are herein referring to as hard mask layer portions (not shown). Each of the hard mask layer portions contains a fin portion having a same width as the width of the fin-defining spacers 80. Each of dielectric liner layer portions contains a fin portion having a same width as the width of the fin-defining spacers 80. The fin portions of the dielectric liner layer portions are herein referred to as dielectric liners 82. The fin portions of the hard mask layer portions are herein referred to as dielectric fin portions 84.

Subsequently, the fin-defining spacers 80 can be removed selective to the hard mask layer 74 and the top semiconductor layer 30 by a recess etch, which can be an anisotropic or an isotropic etch. Alternatively, the fin-defining spacers 80 can also be removed by CMP. The removal of the fin-defining spacers 80 exposes the dielectric fin portions 84 which can be employed as an etch mask during the etching of the top semiconductor layer 30.

Next, physically exposed portions of the top semiconductor layer 30, the recessed conductive material portions 52A, non-fin portions of the hard mask layer portions and non-fin portions of the dielectric liner layer portions can be removed by an anisotropic etch employing the dielectric fin portions 84 as an etch mask and the buried insulator layer 20 as a stopping layer. The anisotropic etch can be a dry etch or a wet etch selective to the dielectric material of the buried insulator layer 20.

After transferring the pattern in the fin-defining spacers 80 into various underlying layers (74, 72, 30, 52A), each remaining portion of the top semiconductor layer 30 constitutes a semiconductor fin 86. The direction along which the semiconductor fins 86 laterally extend the most is herein referred to as a "lengthwise direction" of the semiconductor fins 86. The width of the semiconductor fins 86 can be substantially the same as the width of the fin-defining spacers 80, as measured at the base. In one embodiment, the width of the semiconductor fins 86 can be from 5 nm to 30 nm, although lesser and greater thicknesses can also be employed.

Each remaining portion of the recessed conductive material portions 52A constitutes a conductive strap structure 54. In one embodiment and as shown in FIG. 8B, each conductive strap structure 54 includes a lower portion vertically contacting the inner electrode 44 and an upper portion having a first portion laterally contacting a sidewall of a semiconductor fin 86 and a seconding portion laterally contacting a sidewall of the buried insulator layer 20. Thus, laterally contacting pairs of a semiconductor fin 86 and a conductive strap structure 54 are formed. In each laterally contacting pairs, the semiconductor fin 86 and the first portion of the upper portion of the conductive strap structure 54 have a same width throughout.

Each remaining non-fin portion of the hard mask layer portions and a corresponding remaining non-fin portion of the dielectric liner layer portions in the cavities 55 collectively constitute a dielectric trench fill portion 88.

Figure 9A:
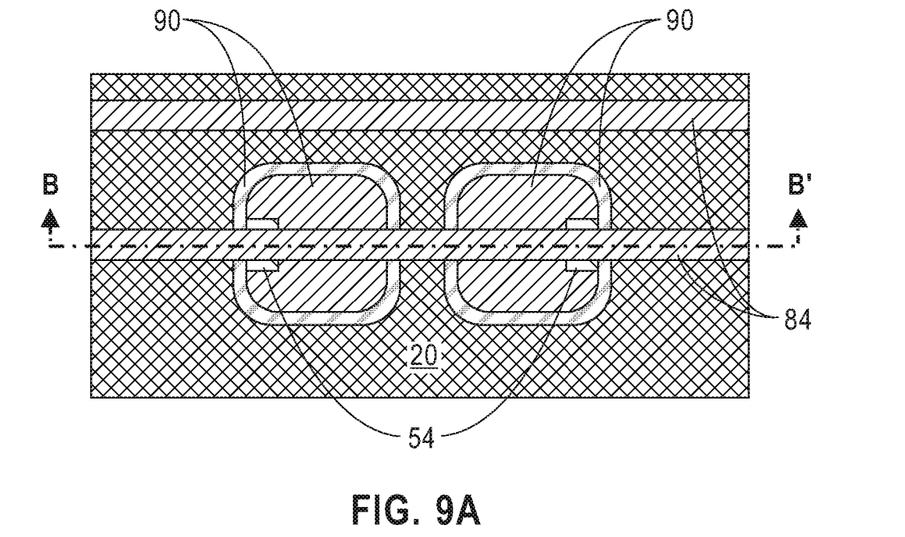
FIG. 9A is a top-down view of the exemplary semiconductor structure of FIGS. 8A-8B after removing semiconductor fin between neighboring deep trenches and forming dielectric caps.
Figure 9B:
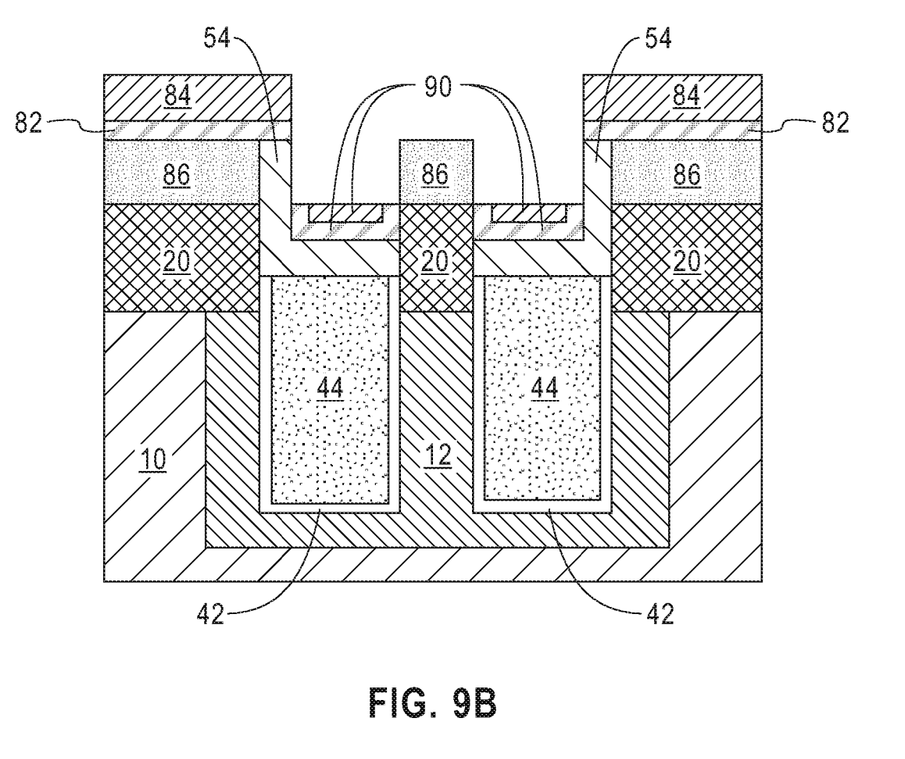
FIG. 9B is a cross-sectional view of the exemplary semiconductor structure of FIG. 9A along the vertical plane B-B'.

Referring to FIGS. 9A-9B, the semiconductor fin 86 and a portion of the dielectric fin portion 84 located between the neighboring conductive strap structures 54 and portions of the dielectric trench fill portions 88 located above the top surface of the buried insulator layer 20 can be removed by conventional lithographic and etching processes. Specifically, the processing steps as described above in FIGS. 4A and 4B can be used to form lithographic stack portions (not shown) over the dielectric fin portions 84, the dielectric trench fill portions 88 and the buried insulator layer 20. The lithographic stack portions cover the conductive strap structures 54 and the semiconductor fins 86 abutting the conductive strap structures 54, while exposing the semiconductor fin 86, the dielectric fin portion 84 and the dielectric trench fill portions 88 located between the conductive strap structures 54. At least one etch can be performed to remove the exposed portion of the dielectric fin portion 84 and the underlying semiconductor fin 86 and dielectric trench fill portions 88 selective to the dielectric material of the buried insulator layer 20. The at least one etch can be a dry etch such as RIE or a wet etch. The remaining portions of the dielectric trench fill portions 88 that are embedded within the deep trenches 40 constitute the dielectric caps 90. The dielectric caps 90 have top surfaces coplanar with the top surface of the buried insulator layer 20. Each dielectric cap 90 vertically contacts the lower portion of one of the conductive structure 54 and laterally surrounding the second portion of upper portion of one of the conductive strap structure 54.

At this point of the present application, conventional processing steps may be carried out to provide FinFETs. For example, gate structures each of which overlying a channel portion of a semiconductor fin can be formed utilizing a gate first or a gate last process (not shown). Subsequently, epitaxial growth of a semiconductor material can be performed to form source/drain regions on the semiconductor fin on opposite sides of the channel region.

In the present application, the dielectric cap is formed in the deep trench and on top of a portion of the conductive strap structure embedded in the deep trench. Because the epitaxial growth of the semiconductor material during the formation of source/drain regions of FinFETs could not occur on dielectric surfaces including the top surface of the dielectric cap, no epitaxial grown semiconductor material can be extended out of the deep trench. The dielectric cap thus can prevent the shorts between the neighboring deep trenches.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
a semiconductor fin located on a substrate;
a deep trench capacitor embedded in said substrate;
a conductive strap structure overlying said deep trench capacitor, wherein said conductive strap structure comprises a lower portion vertically contacting topmost surfaces of said deep trench capacitor and an upper portion adjoined a portion of said lower portion, said upper portion having a first portion laterally contacting said semiconductor fin and a second portion underlying said first portion contacting a portion of said lower portion; and
a dielectric cap embedded in said substrate, said dielectric cap vertically contacting another portion of said lower portion of said conductive strap structure and laterally surrounding said second portion of said upper portion of said conductive strap structure,
wherein a bottom surface of said semiconductor fin and a top surface of said dielectric cap are coplanar with a topmost surface of said substrate.

2. The semiconductor structure of claim 1, wherein said deep trench capacitor comprises an inner electrode, a node dielectric, and an outer electrode.

3. The semiconductor structure of claim 1, wherein said conductive strap structure comprises a doped elemental semiconductor material, a doped compound semiconductor material, or an alloy thereof.

4. The semiconductor structure of claim 1, wherein a sidewall of said semiconductor fin and a sidewall of said conductive strap structure are within a same vertical plane.

5. The semiconductor structure of claim 1, wherein a top surface of said semiconductor fin is coplanar with a top surface of said upper portion of said conductive strap structure.

6. The semiconductor structure of claim 1, further comprising a dielectric fin portion overlying, and in contact with, a top surface of said semiconductor fin and a top surface of said upper portion of said conductive strap structure.

7. The semiconductor structure of claim 6, wherein said topmost surfaces of said deep trench capacitor is located between a top surface of a buried insulator layer in said substrate and a bottom surface of said buried insulator layer, and wherein said second portion of said upper portion of said conductive strap structure contacts a portion of a sidewall of said insulator layer, and said dielectric cap contacts a remaining portion of said sidewall of said buried insulator layer.

8. The semiconductor structure of claim 1, wherein said semiconductor fin and said first portion of said upper portion of said conductive strap structure have a same width.

9. A semiconductor structure comprising:
a semiconductor fin located on a substrate;
a deep trench capacitor embedded in said substrate;
a conductive strap structure overlying said deep trench capacitor, wherein said conductive strap structure comprises a lower portion vertically contacting topmost surfaces of said deep trench capacitor and an upper portion adjoined a portion of said lower portion, said upper portion having a first portion laterally contacting said semiconductor fin and a second portion underlying said first portion contacting a portion of said lower portion;
a dielectric cap embedded in said substrate, said dielectric cap vertically contacting another portion of said lower portion of said conductive strap structure and laterally surrounding said second portion of said upper portion of said conductive strap structure; and
a dielectric fin portion overlying, and in contact with, a top surface of said semiconductor fin and a top surface of said upper portion of said conductive strap structure.

10. A semiconductor structure comprising:
a semiconductor fin located on a substrate;
a deep trench capacitor embedded in said substrate;
a conductive strap structure overlying said deep trench capacitor, wherein said conductive strap structure comprises a lower portion vertically contacting topmost surfaces of said deep trench capacitor and an upper portion adjoined a portion of said lower portion, said upper portion having a first portion laterally contacting said semiconductor fin and a second portion underlying said first portion contacting a portion of said lower portion; and
a dielectric cap embedded in said substrate, said dielectric cap vertically contacting another portion of said lower portion of said conductive strap structure and laterally surrounding said second portion of said upper portion of said conductive strap structure, wherein said semiconductor fin and said first portion of said upper portion of said conductive strap structure have a same width.

\* \* \* \* \*